(12) United States Patent
Vats et al.

(10) Patent No.: US 11,217,443 B2
(45) Date of Patent: Jan. 4, 2022

(54) SEQUENTIAL DEPOSITION AND HIGH FREQUENCY PLASMA TREATMENT OF DEPOSITED FILM ON PATTERNED AND UN-PATTERNED SUBSTRATES

(71) Applicant: Applied Materials, Inc., Santa Clara, CA (US)

(72) Inventors: Vinayak Veer Vats, San Ramon, CA (US); Hang Yu, San Jose, CA (US); Philip Allan Kraus, San Jose, CA (US); Sanjay G. Kamath, Fremont, CA (US); William John Durand, San Francisco, CA (US); Lakmal Charidu Kalutarage, San Jose, CA (US); Abhijit B. Mallick, Fremont, CA (US); Changling Li, Sunnyvale, CA (US); Deenesh Padhi, Santa Clara, CA (US); Mark Joseph Saly, Milpitas, CA (US); Thai Cheng Chua, Cupertino, CA (US); Mihaela A. Balseanu, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 237 days.

(21) Appl. No.: 16/676,097

(22) Filed: Nov. 6, 2019

(65) Prior Publication Data
US 2020/0176241 A1 Jun. 4, 2020

Related U.S. Application Data

(60) Provisional application No. 62/774,022, filed on Nov. 30, 2018.

(51) Int. Cl.
*H01L 21/311* (2006.01)
*H01L 21/02* (2006.01)
(Continued)

(52) U.S. Cl.
CPC ........ *H01L 21/0217* (2013.01); *C23C 16/345* (2013.01); *C23C 16/56* (2013.01);
(Continued)

(58) Field of Classification Search
CPC ........... H01L 21/0217; H01L 21/02247; H01L 21/02252; H01L 21/02274; H01L 21/0228;
(Continued)

(56) References Cited

U.S. PATENT DOCUMENTS 9,214,333 B1 * 12/2015 Sims ..................... C23C 16/52
10,892,156 B2 * 1/2021 Woodruff ............ H01L 21/0234
(Continued)

FOREIGN PATENT DOCUMENTS

TW 2004/02792 2/2004
TW 2007/07579 2/2007
(Continued)

OTHER PUBLICATIONS

International Search Report and Written Opinion from Patent Application No. PCT/US2019/060625 dated Mar. 4, 2020, 11 pgs.
(Continued)

*Primary Examiner* — Brook Kebede
(74) *Attorney, Agent, or Firm* — Schwabe, Williamson & Wyatt, P.C.

(57) ABSTRACT

Embodiments disclosed herein include methods of forming high quality silicon nitride films. In an embodiment, a method of depositing a film on a substrate may comprise forming a silicon nitride film over a surface of the substrate in a first processing volume with a deposition process, and treating the silicon nitride film in a second processing volume, wherein treating the silicon nitride film comprises exposing the film to a plasma induced by a modular high-frequency plasma source. In an embodiment, a sheath poten-
(Continued)

tial of the plasma is less than 100 V, and a power density of the high-frequency plasma source is approximately 5 W/cm$^2$ or greater, approximately 10 W/cm$^2$ or greater, or approximately 20 W/cm$^2$ or greater.

20 Claims, 8 Drawing Sheets

(51) Int. Cl.
    *H01J 37/32*     (2006.01)
    *C23C 16/34*     (2006.01)
    *C23C 16/56*     (2006.01)

(52) U.S. Cl.
    CPC .. *H01J 37/32155* (2013.01); *H01J 37/32192* (2013.01); *H01L 21/0228* (2013.01); *H01L 21/0234* (2013.01); *H01L 21/02247* (2013.01); *H01L 21/02252* (2013.01); *H01L 21/02274* (2013.01); *H01L 21/02329* (2013.01); *H01L 21/31116* (2013.01); *H01J 2237/3321* (2013.01); *H01J 2237/3341* (2013.01)

(58) Field of Classification Search
    CPC ........... H01L 21/02329; H01L 21/0234; H01L 21/31116; H01L 21/67703; H01L 21/68771; C23C 16/00; C23C 16/045; C23C 16/345; C23C 16/45542; C23C 16/45551; C23C 16/56; H01J 37/32155; H01J 37/32192
    USPC ......................................................... 438/703
    See application file for complete search history.

(56) References Cited

U.S. PATENT DOCUMENTS

| | | |
|---|---|---|
| 2006/0043065 A1 | 3/2006 | Buchberger et al. |
| 2006/0269693 A1* | 11/2006 | Balseanu .......... H01L 21/02348 427/569 |
| 2010/0101727 A1 | 4/2010 | Helin |
| 2012/0228123 A1 | 9/2012 | Han et al. |
| 2013/0189854 A1* | 7/2013 | Hausmann .............. C23C 16/52 438/792 |
| 2014/0273530 A1* | 9/2014 | Nguyen .............. H01L 21/0228 438/792 |

FOREIGN PATENT DOCUMENTS

| | | |
|---|---|---|
| WO | WO 2010-117969 | 10/2010 |
| WO | WO 2014-197146 | 12/2014 |

OTHER PUBLICATIONS

International Preliminary Report on Patentability from PCT/US2019/060625 dated Jun. 10, 2021, 6 pgs.

Official Letter from Taiwain Patent Application No. 108143154 dated Oct. 6, 2021, 13 pgs.

* cited by examiner

SEQUENTIAL DEPOSITION AND HIGH FREQUENCY PLASMA TREATMENT OF DEPOSITED FILM ON PATTERNED AND UN-PATTERNED SUBSTRATES

This application claims the benefit of U.S. Provisional Application No. 62/774,022, filed on Nov. 30, 2018, the entire contents of which are hereby incorporated by reference herein.

BACKGROUND

1) Field

Embodiments relate to a modular high-frequency plasma source, and more particular to a method of forming thin films with the modular high-frequency plasma source.

2) Description of Related Art

The rapid shrinking of electronic devices towards increased speed and density lead to the reduction of the thicknesses of thin films deposited by one or more of chemical vapor deposition (CVD), plasma enhanced CVD (PECVD), atomic layer deposition (ALD), and plasma enhanced ALD (PEALD). Particularly, the lower film thickness has limited the effectiveness of film functionality, such as hermeticity, electrical resistance, and others.

Furthermore, efforts to improve the functionality of thin films is not without issue. Since the films are thin, treatments to the films may negatively impact underlying layers. Accordingly, while existing methods allow for the deposition of such thin films, such thin films do not currently have the desired characteristics to provide devices with such scaled down dimensions.

SUMMARY

Embodiments disclosed herein include methods of forming high quality films. In an embodiment, a method of depositing a film on a substrate may comprise forming a silicon nitride film over a surface of the substrate in a first processing volume with a deposition process, and treating the silicon nitride film in a second processing volume, wherein treating the silicon nitride film comprises exposing the film to a plasma induced by a modular high-frequency plasma source. In an embodiment, a sheath potential of the plasma is less than 100 V, and a power density of the high-frequency plasma source is approximately 5 W/cm$^2$ or greater, approximately 10 W/cm$^2$ or greater, or approximately 20 W/cm$^2$ or greater.

Embodiments may also include a method of depositing a film on a substrate that comprises depositing a film comprising silicon over a surface of the substrate in a first processing volume. In an embodiment the method may further comprise treating the film with a first plasma process, where the first plasma process is an RF induced plasma comprising nitrogen and helium to form a silicon nitride film. In an embodiment the method may further comprise exposing the silicon nitride film to a second plasma process, where the second plasma process is an RF induced plasma comprising species suitable for etching the silicon nitride film. In an embodiment, the method may further comprise treating the silicon nitride film with a third plasma process in a second processing volume, where the third plasma process comprises a plasma induced by a modular high-frequency plasma source.

Embodiments may also comprise a method of forming a high quality silicon nitride film. The method may comprise (a) depositing a film comprising silicon over a surface of a substrate with a plasma enhanced chemical vapor deposition (PECVD) process in a first processing volume, (b) treating the film comprising silicon in-situ with a first RF plasma, where the RF plasma comprises nitrogen and helium to form a silicon nitride film, (c) etching the silicon nitride with a second RF plasma, wherein the second RF plasma comprises one or more of fluorine, chlorine, nitrogen, and carbon, and (d) treating the silicon nitride film with a microwave plasma, where the microwave plasma is induced by a modular microwave plasma source.

The above summary does not include an exhaustive list of all embodiments. It is contemplated that all systems and methods are included that can be practiced from all suitable combinations of the various embodiments summarized above, as well as those disclosed in the Detailed Description below and particularly pointed out in the claims filed with the application. Such combinations have particular advantages not specifically recited in the above summary.

DETAILED DESCRIPTION

Devices in accordance with embodiments described herein include a processing tool with a modular high-frequency plasma source and methods of using such a tool to fabricate thin silicon nitride films on a substrate. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, current processing methods are not suitable for forming high quality thin films. Accordingly, embodiments disclosed herein include thin films that are deposited with a suitable deposition process (e.g., CVD, PECVD, ALD, or PEALD) and subsequently treated with a plasma generated from a modular high-frequency plasma source. Treating the film with a plasma generated from such a source has several benefits.

First, a plasma generated from a high-frequency plasma source has a higher density and/or includes a higher concentration of excited neutral species than in other plasma types (such as a plasma generated with an RF source). Accordingly, there are more active species that are available for treating the surface of the film. For example, the treated film may have lower hydrogen content. The treated film may also have an increased number of sites where subsequent bonding can occur. For example, in a silicon nitride film, the treated film may have a nitrogen concentration that is closer to the ideal stoichiometric ratio of silicon to nitrogen (i.e., 3:4), which leads to a film with increased density.

Additionally, high-frequency plasmas may be generated with sheath potentials that are significantly lower than the sheath potential of RF plasmas. For example, the sheath potential of a plasma generated with a high-frequency plasma source may be approximately 10 V compared to approximately 100 V in an RF plasma. Accordingly, the underlying layers below the thin film are less likely to be damaged by the treatment process. Therefore, films with a thickness of less than 1 nm are able to fabricated without damaging underlying layers.

Figure 1A:
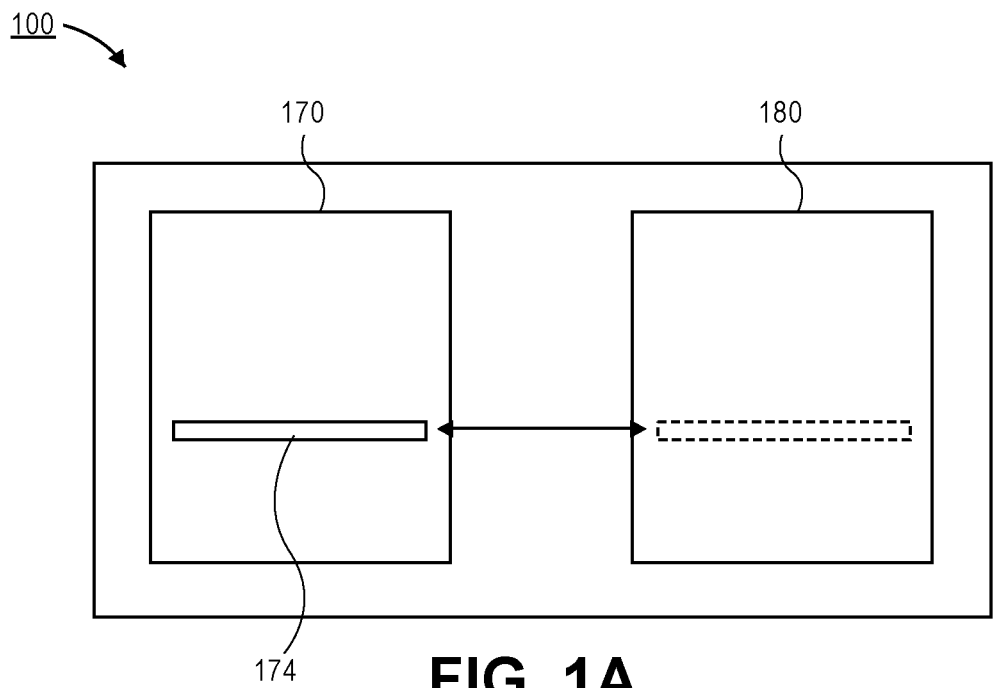
FIG. 1A is a schematic diagram of a processing tool for forming high quality thin films with a first processing volume for depositing the film and a second processing volume with a modular high-frequency plasma source for treating the film, in accordance with an embodiment.

Referring now to FIG. 1A, a schematic diagram of a processing tool 100 for forming a high-quality thin film is shown, in accordance with an embodiment. In an embodiment, the processing tool 100 may comprise a first processing volume 170 and a second processing volume 180. The first processing volume 170 may be for depositing the thin film. For example, the first processing volume 170 may be suitable for one or more of CVD, PECVD, ALD, and PEALD processes. The second processing volume 180 may be for treating the deposited film with a high-frequency plasma. For example, the second processing volume 180 may comprise a modular high-frequency plasma source. A more detailed description of the second processing volume 180 is provided below with respect to FIGS. 2-4.

In an embodiment, the first processing volume 170 and the second processing volume 180 may be connected to each other in a single processing tool 100. For example, in FIG. 1A, a substrate 174 may be passed between the first processing volume 170 and the second processing volume 180 (as indicated by the arrow). In a particular embodiment, the processing tool 100 may be a cluster tool that includes a plurality of discrete processing volumes that are accessible through a load lock. In such an embodiment, the substrate 174 may be passed between the two processing volumes 170 and 180 by being passed through the load lock by a substrate handling robot or the like. In other embodiments, the processing tool 100 may have a global volume with the first processing volume 170 and the second processing volume 180 being fluidically coupled to each other. In such embodiments, the substrate 174 may be rotated between the first processing volume 170 and the second processing volume 180 without leaving the global volume of the processing tool 100.

Figure 1B:
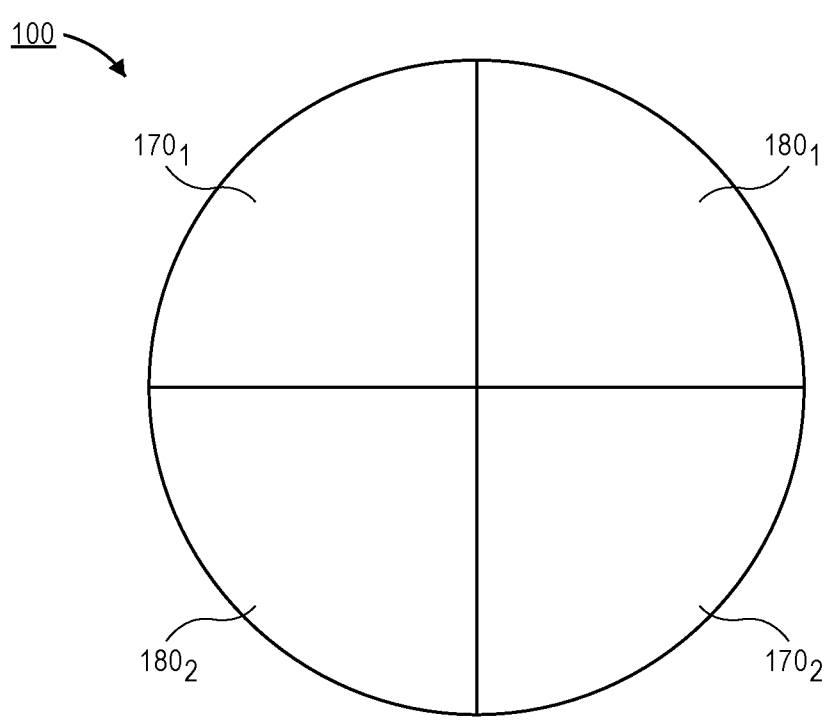
FIG. 1B is a schematic diagram of a processing tool for forming high quality thin films with a plurality of processing volumes, where at least one of the processing volumes includes a modular high-frequency plasma source for treating the film, in accordance with an embodiment.

Referring now to FIG. 1B, a schematic diagram of a processing tool 100 with a plurality of first processing volumes $170_{1-2}$ and second processing volumes $180_{1-2}$ is shown, in accordance with an embodiment. In an embodiment, the first processing volumes $170_1$ and $170_2$ may be substantially similar to each other and the second processing volumes $180_1$ and $180_2$ may be substantially similar to each other.

In other embodiments, the first processing volumes $170_1$ and $170_2$ may be different from each other. For example, first processing volume $170_1$ may be configured for depositing a first type of film and first processing volume $170_2$ may be configured for depositing a second type of film. In such embodiments, an alternating stack of the first type of thin film and the second type of thin film may be formed. In other embodiments, the processing volume $170_1$ may be configured for providing a first processing gas mixture of an ALD process and the second processing volume $170_2$ may be configured for providing a second processing gas mixture of the ALD process. In some embodiments, the second processing volume $180_1$ may be different than the second processing volume $180_2$. For example, different plasma treatments may be implemented in the different second processing volumes $180_1$ and $180_2$.

While two first processing volumes $170_{1-2}$ and two second processing volumes $180_{1-2}$ are shown in FIG. 1B, it is to be appreciated that any number of first processing volumes 170 and any number of second processing volumes 180 may be included in various embodiments. Additionally the number of first processing volumes 170 for depositing films may be different than the number of second processing volumes 180 for treating the deposited films.

Furthermore, while the first processing volumes 170 and the second processing volumes 180 are shown as being integral to a single processing tool 100 in FIGS. 1A and 1B, it is to be appreciated that embodiments are not limited to such configurations. For example, the first processing volume 170 may be in a different processing tool than the second processing volume 180. Additionally, while the second processing volume 180 is described as including a modular high-frequency plasma source, it is to be appreciated that first processing volume 170 may also include a modular high-frequency plasma source when plasma assisted deposition processes (e.g., PECVD or PEALD) are used to deposit the film.

Figure 2:
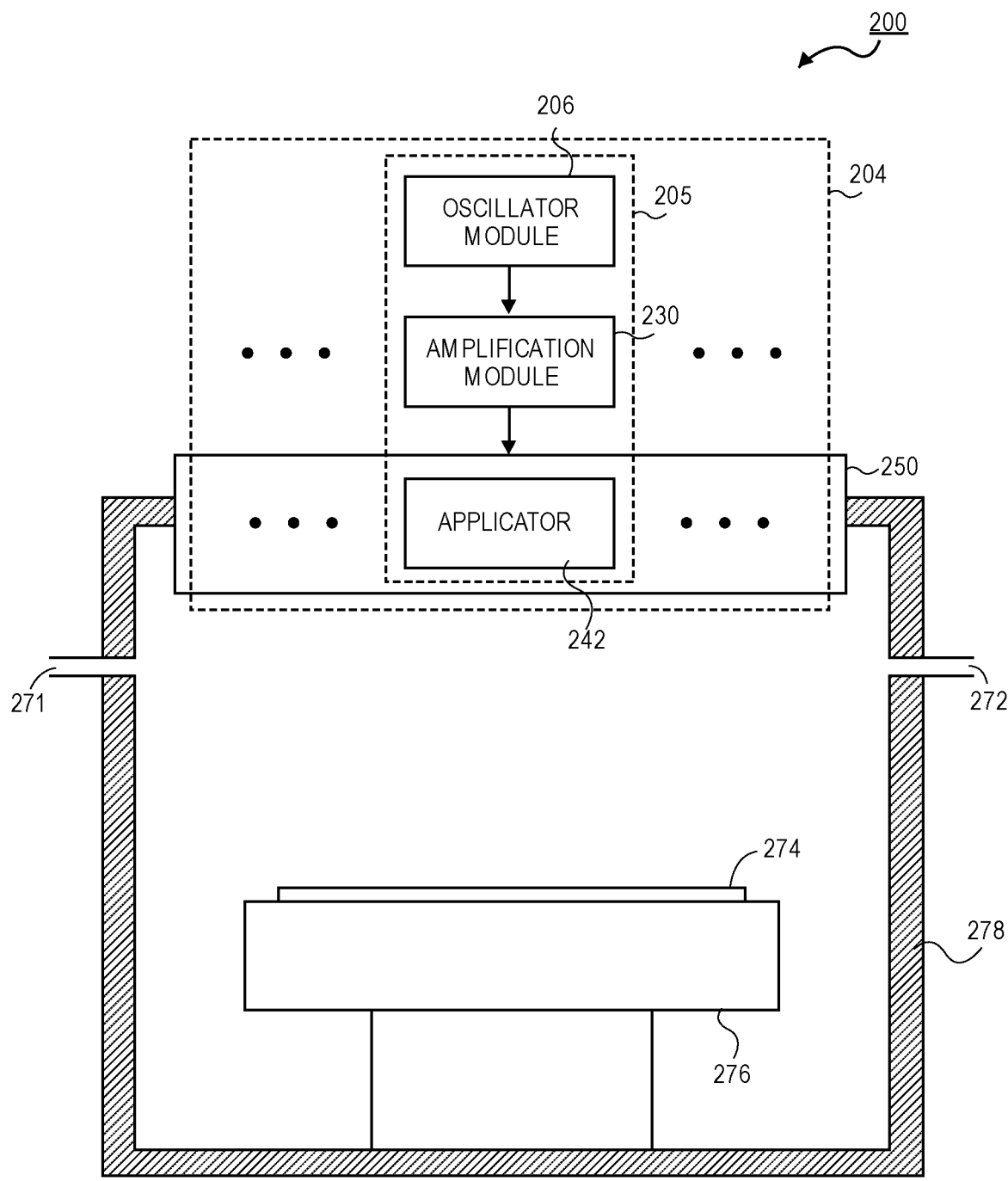
FIG. 2 is a schematic diagram of a processing volume that includes a modular high-frequency plasma source, in accordance with an embodiment.
Figure 3A:
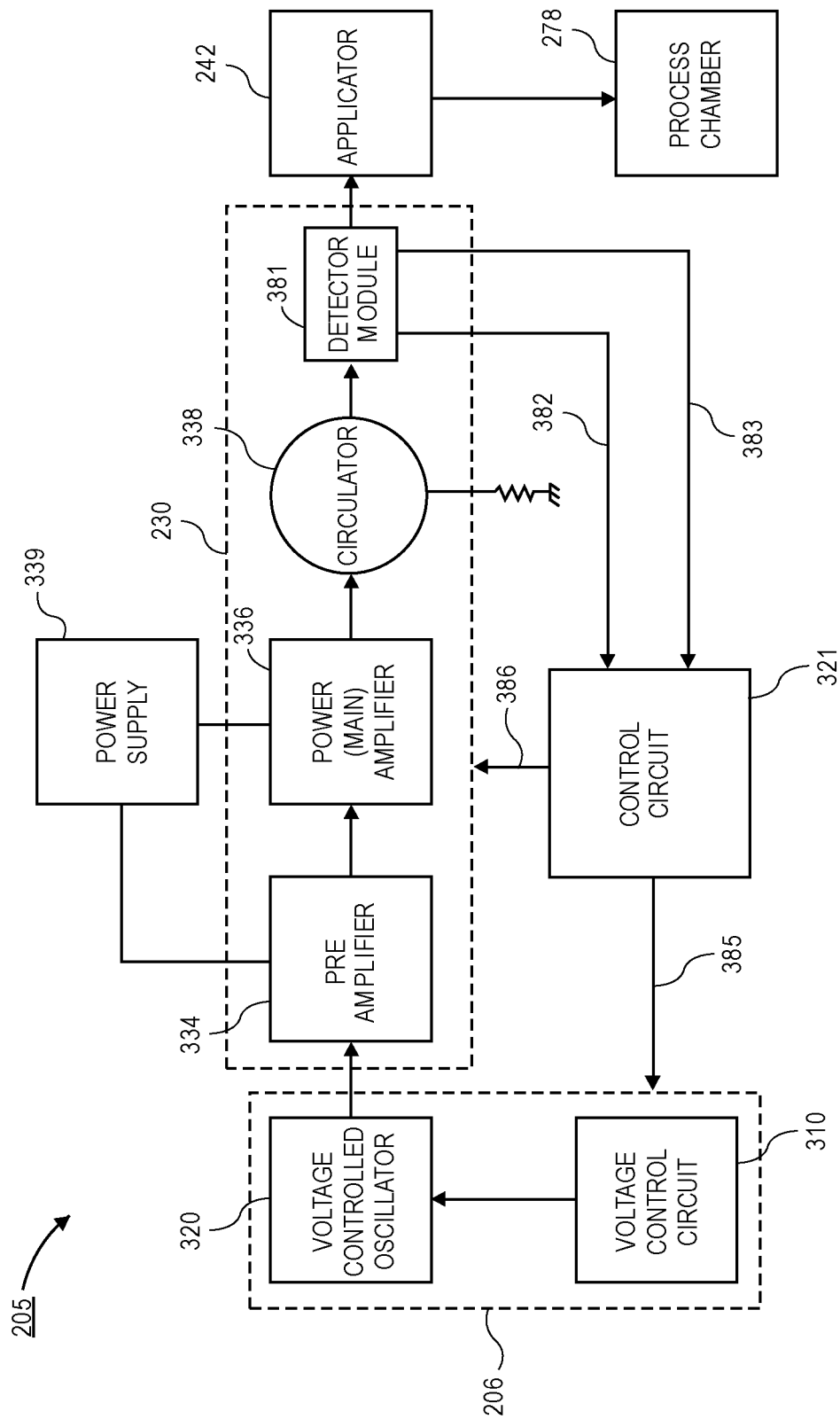
FIG. 3A is a schematic block diagram of a solid state high-frequency plasma source module, in accordance with an embodiment.
Figure 3B:
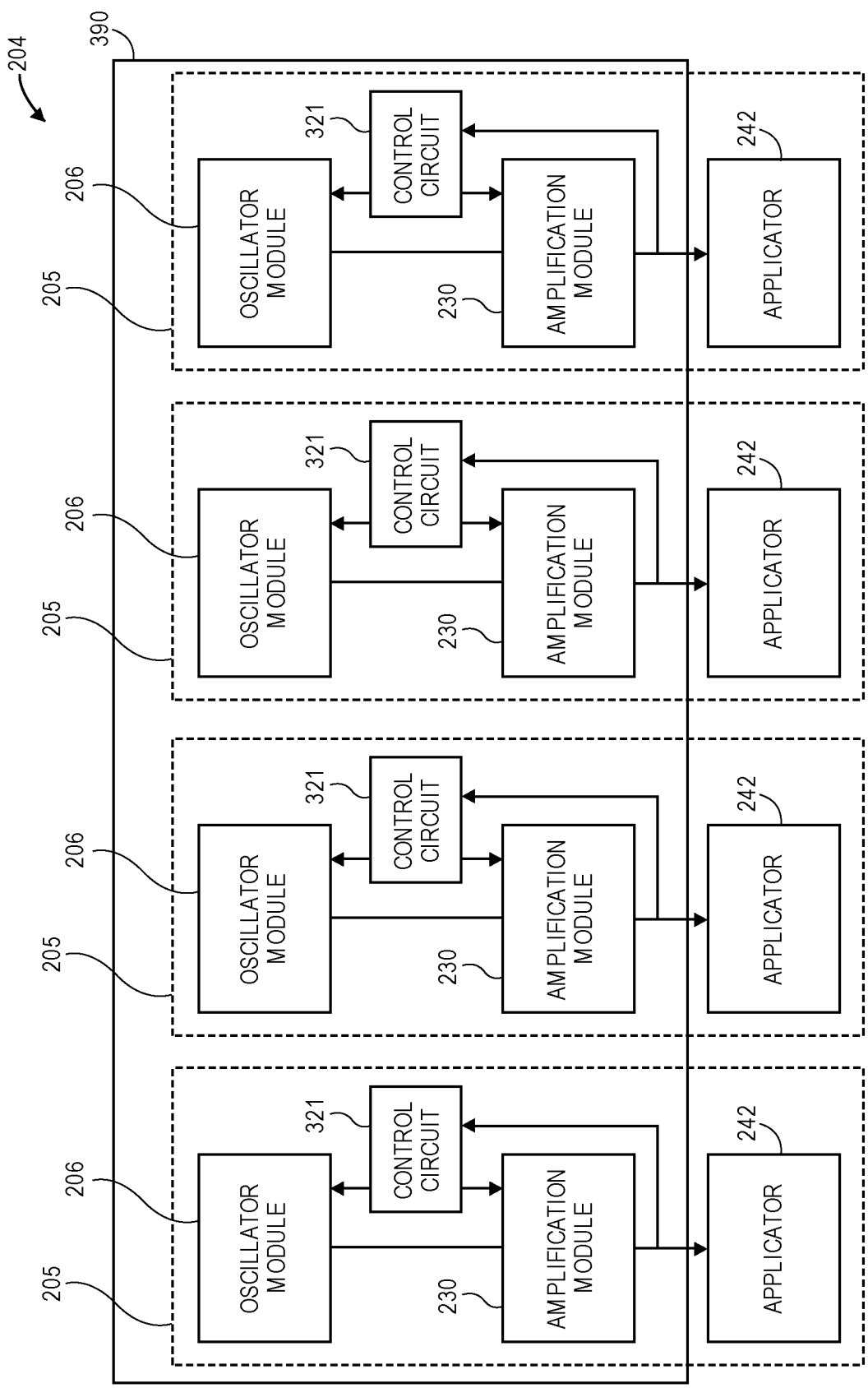
FIG. 3B is a schematic block diagram of a portion of the electronics of a processing tool with a modular high-frequency plasma source that includes a plurality of modular high-frequency plasma source modules, each with an oscillator module and feedback control, in accordance with an embodiment.
Figure 4:
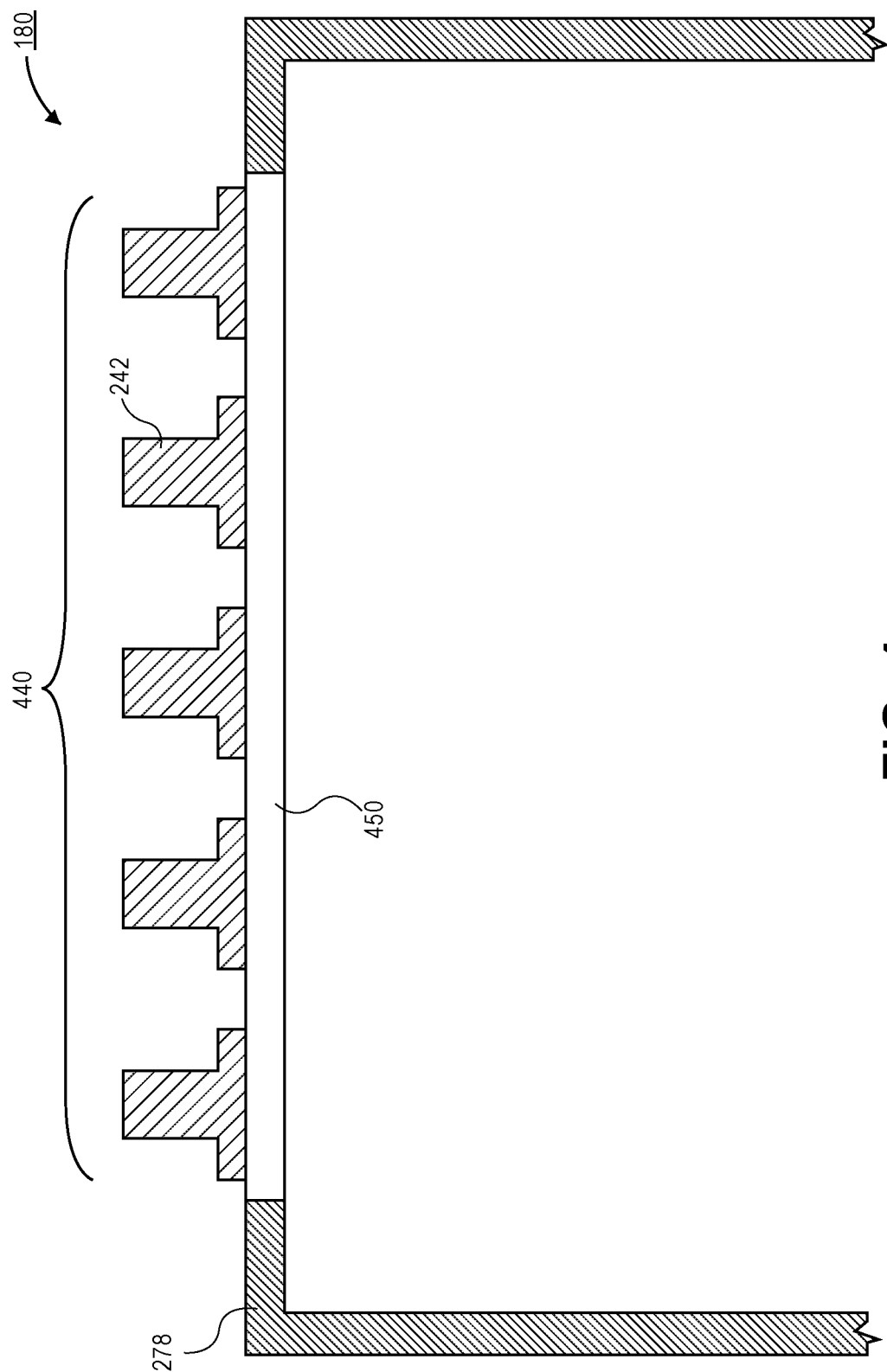
FIG. 4 is a cross-sectional illustration of an array of applicators positioned on a dielectric sheet that is part of the processing chamber, in accordance with an embodiment.

Referring now to FIGS. 2-4, a series of illustrations are shown that depict the modular high-frequency plasma source used to treat the film in the second processing volume 180. Embodiments described herein include a modular high-frequency plasma source that comprises an array of high-frequency plasma source modules. As used herein, "high-frequency" may refer to high-frequency electromagnetic radiation which, includes one or more of radio frequency radiation, very-high-frequency radiation, ultra-high-frequency radiation, and microwave radiation. "High-frequency" may refer to frequencies between 0.1 MHz and 300 GHz. According to an embodiment, each high-frequency plasma source module comprises an oscillator module, an amplification module, and an applicator. In an embodiment, the oscillator module and the amplification module comprise electrical components that are all solid state electronic components.

The use of solid state electronics, instead of for example, a magnetron, allows for a significant reduction in the size and the complexity of a high-frequency plasma source. Additionally, the use of solid state components allows for the elimination of bulky waveguides needed to transmit the high-frequency radiation to the processing chamber. Instead, the high-frequency radiation may be transmitted with coaxial cabling. The elimination of waveguides also allows for the construction of a large area modular high-frequency plasma source where the size of the plasma formed is not limited by the size of waveguides. Instead, an array of high-frequency plasma source modules may be constructed in a given pattern that allows for the formation of a plasma that is arbitrarily large (and arbitrarily shaped) to match the shape of any substrate. Furthermore, the cross-sectional shape of the applicators may be chosen so that the array of applicators may be packed together as tightly as possible (i.e., a closed-packed array).

The use of an array of high-frequency plasma source modules also provides greater flexibility in the ability to locally change the radiation field and/or the plasma density by independently changing the power settings of the amplification module for each high-frequency plasma source module. This allows for uniformity optimization during plasma processing, such as adjustments made for wafer edge effects, adjustments made for incoming wafer nonuniformity, and the ability to adjust the plasma density for processing systems in which a nonuniformity is needed to compensate for the design of the processing system (e.g., to accommodate the nonuniform radial velocity of the rotating wafers in some processing chambers).

In addition to the enhanced tuneability of the plasma, the use of individual high-frequency plasma source modules provides a greater power density than are currently available in existing RF plasma sources. For example, high-frequency plasma source modules may allow for a power density that is approximately five or more times greater than typical RF plasma processing systems. For example, typical power into a PECVD process is approximately 3,000 W, and provides a power density of approximately 4 W/cm$^2$ for a 300 mm diameter wafer. In contrast, high-frequency plasma source modules according to embodiments may use a 300 W power amplifier with a 4 cm diameter applicator, to provide a power density of approximately 24 W/cm$^2$ at an applicator packing density of approximately 1. At an applicator packing density of ⅓ and with use of a 1000 W power amplifier, a power density of 27 W/cm$^2$ is provided. At an applicator packing density of 1 and with use of a 1000 W power amplifier, a power density of 80 W/cm$^2$ is provided. In a particular embodiment, a power density of the high-frequency plasma source is approximately 5 W/cm$^2$ or greater, approximately 10 W/cm$^2$ or greater, or approximately 20 W/cm$^2$ or greater.

Usual approaches for making high-frequency plasmas (e.g., microwave plasmas) involve the use of a single oscillator module and a single electrode or applicator to couple the high-frequency energy to the process gas. However, using multiple electrode/applicator structures with a single oscillator module that is split to power each of the multiple electrodes/applicators has drawbacks. Particularly, an interference pattern will necessarily form because the electromagnetic radiation generated by single oscillator module results in electromagnetic radiation emitted by each applicator to be at the same frequency and at a fixed phase with each other. The interference pattern produces local maxima and minima that result in a nonuniform radiation field and/or plasma.

Accordingly, embodiments include an array of high-frequency emission modules with each high-frequency emission module having its own oscillator module. When a plurality of oscillator modules are used, the electromagnetic radiation generated by a first oscillator module may not interfere with the electromagnetic radiation generated by a second oscillator module because the first and second oscillator modules may not be at the same frequency nor have a controlled phase difference between the first and second oscillator modules. Accordingly, the plasma will have improved uniformity since there is no interference pattern.

Referring now to FIG. 2, a cross-sectional illustration of a processing volume 180 is shown, according to an embodiment. In some embodiments, the processing volume 180 may be a processing tool suitable for treating films with a plasma. Generally, embodiments include a processing volume 180 that includes a chamber 278. In processing volumes 180, the chamber 278 may be a vacuum chamber. A vacuum chamber may include a pump (not shown) for removing gases from the chamber to provide the desired vacuum. Additional embodiments may include a chamber 278 that includes one or more gas lines 271 for providing processing gasses into the chamber 278 and exhaust lines 272 for removing byproducts from the chamber 278. While not shown, it is to be appreciated that the processing volume 180 may include a showerhead for evenly distributing the processing gases over a substrate 274.

In an embodiment, the substrate 274 may be supported on a chuck 276. For example, the chuck 276 may be any suitable chuck, such as an electrostatic chuck. The chuck may also include cooling lines and/or a heater to provide temperature control to the substrate 274 during processing. Due to the modular configuration of the high-frequency emission modules described herein, embodiments allow for the processing volume 180 to accommodate any sized substrate 274. For example, the substrate 274 may be a semiconductor wafer (e.g., 200 mm, 300 mm, 450 mm, or larger). Alternative embodiments also include substrates 274 other than semiconductor wafers. For example, embodiments may include a processing volume 180 configured for processing glass substrates, (e.g., for display technologies).

According to an embodiment, the processing volume 180 includes a modular high-frequency plasma source 204. The modular high-frequency plasma source 204 may comprise an array of high-frequency plasma source modules 205. In an embodiment, each high-frequency plasma source module 205 may include an oscillator module 206, an amplification module 230, and an applicator 242. In an embodiment, the oscillator module 206 and the amplification module 230 may comprise electrical components that are solid state electrical components. In an embodiment, each of the plurality of oscillator modules 206 may be communicatively coupled to different amplification modules 230. In some embodiments, there may be a 1:1 ratio between oscillator modules 206 and amplification modules 230. For example, each oscillator module 206 may be electrically coupled to a single amplification module 230. In an embodiment, the plurality of oscillator modules 206 may generate electromagnetic radiation that is at more than one frequency, and that does not have a controlled phase relationship. Accordingly, the electromagnetic radiation induced in the chamber 278 will not interact in a manner that results in an undesirable interference pattern.

In an embodiment, each oscillator module 206 generates electromagnetic radiation that is transmitted to the amplification module 230. After processing by the amplification module 230, the electromagnetic radiation is transmitted to the applicator 242. According to an embodiment, an array of applicators 242 are coupled to the chamber 278 and each emit electromagnetic radiation into the chamber 278. In some embodiments, the applicators 242 couple the electromagnetic radiation to the processing gasses in the chamber 278 to produce a plasma. In an embodiment, there may be one or more applicators 242 coupled to each oscillator module 206.

Referring now to FIG. 3A, a schematic block diagram of the electronics in a high-frequency plasma source module 205 in the modular high-frequency plasma source 204 is shown, according to an embodiment. In an embodiment, each oscillator module 206 includes a voltage control circuit 310 for providing an input voltage to a voltage controlled oscillator 320 in order to produce high-frequency electromagnetic radiation at a desired frequency. Embodiments may include an input voltage between approximately 1V and 10V DC. The voltage controlled oscillator 320 is an electronic oscillator whose oscillation frequency is controlled by the input voltage. According to an embodiment, the input voltage from the voltage control circuit 310 results in the voltage controlled oscillator 320 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz. In an embodiment, one or more of the plurality of oscillator modules 206 may emit electromagnetic radiation at different frequencies.

According to an embodiment, the electromagnetic radiation is transmitted from the voltage controlled oscillator 220 to the amplification module 230. The amplification module 230 may include a driver/pre-amplifier 334, and a main power amplifier 336 that are each coupled to a power supply 339. According to an embodiment, the amplification module 230 may operate in a pulse mode. For example, the amplification module 130 may have a duty cycle between 1% and 99%.

In a more particular embodiment, the amplification module 230 may have a duty cycle between approximately 15% and 50%.

In an embodiment, the electromagnetic radiation may be transmitted to the applicator 242 after being processed by the amplification module 230. However, part of the power transmitted to the applicator 242 may be reflected back due to the mismatch in the output impedance. Accordingly, some embodiments include a detector module 381 that allows for the level of forward power 383 and reflected power 382 to be sensed and fed back to the control circuit module 321. It is to be appreciated that the detector module 381 may be located at one or more different locations in the system. In an embodiment, the control circuit module 321 interprets the forward power 383 and the reflected power 392, and determines the level for the control signal 385 that is communicatively coupled to the oscillator module 206 and the level for the control signal 386 that is communicatively coupled to the amplifier module 230. In an embodiment, control signal 385 adjusts the oscillator module 206 to optimize the high-frequency radiation coupled to the amplification module 230. In an embodiment, control signal 386 adjusts the amplifier module 230 to optimize the output power coupled to the applicator 242. In an embodiment, the feedback control of the oscillator module 206 and the amplification module 230 may allow for the level of the reflected power to be less than approximately 5% of the forward power. In some embodiments, the feedback control of the oscillator module 206 and the amplification module 230 may allow for the level of the reflected power to be less than approximately 2% of the forward power.

Accordingly, embodiments allow for an increased percentage of the forward power to be coupled into the processing chamber 278, and increases the available power coupled to the plasma. Furthermore, impedance tuning using a feedback control is superior to impedance tuning in typical slot-plate antennas. In slot-plate antennas, the impedance tuning involves moving One or more slugs formed in the applicator. This involves mechanical motion of components in the applicator, which increases the complexity of the applicator. Furthermore, the mechanical motion may not be as precise as the change in frequency that may be provided by a voltage controlled oscillator 220.

Referring now to FIG. 3B, a schematic of a portion of the solid state electronics of a modular high-frequency plasma source 204 with an array of high-frequency plasma source modules 205 is shown, in accordance with an embodiment. In the illustrated embodiment, each high-frequency plasma source module 205 includes an oscillator module 206 that is communicatively coupled to a different amplification module 230. Each of the amplification modules 230 may be coupled to different applicators 242. In an embodiment, a control circuit 321 may be communicatively coupled to the oscillator module 206 and the amplification module 230.

In the illustrated embodiment, each of the oscillator modules 206 and the amplification modules 230 are formed on a single board 390, such as a printed circuit board (PCB). However, it is to be appreciated that the oscillator modules 206 and the amplification module 230 may be formed on two or more different boards 390. In the illustrated embodiment four high-frequency plasma source modules 305 are shown. However, it is to be appreciated that the modular high-frequency plasma source 204 may include two or more high-frequency plasma source modules 205. For example the modular high-frequency emission source 204 may include 2 or more high-frequency plasma source modules, 5 or more high-frequency plasma source modules, 10 or more high-frequency plasma source modules, or 25 or more high-frequency plasma source modules.

Referring now to FIG. 4, an illustration of a portion of a processing volume 180 with an array 440 of applicators 242 coupled to the chamber 278 is shown, according to an embodiment. In the illustrated embodiment, the high-frequency electromagnetic radiation from the applicators 242 is coupled into the chamber 278 by being positioned proximate to a dielectric plate 450. The proximity of the applicators 242 to the dielectric plate 450 allows for the high-frequency radiation resonating in a dielectric resonant cavity of the applicators 242 to couple with the dielectric plate 450, which may then couple with processing gasses in the chamber to generate a plasma. In one embodiment, the applicators 242 may be in direct contact with the dielectric plate 450. In an additional embodiment, the applicators 242 may be spaced away from a surface of the dielectric plate 450, so long as the microwave radiation can still be transferred to the dielectric plate 450. In additional embodiments, the applicators 242 may be set into cavities in the dielectric plate 450. In yet another embodiment, the applicators 242 may pass through the dielectric plate 450, so that the applicators 242 are exposed to the interior of the chamber 278.

In an embodiment, the applicators 242 may include any antenna design that is configured to emit any frequency of the high-frequency electromagnetic radiation. In an embodiment, the array 440 of applicators may include more than one applicator 242 design. For example, the array 440 of applicators 242 may include a first applicator for emitting a first high-frequency radiation and a second applicator for emitting a second high-frequency radiation that is different than the first high-frequency radiation.

According to an embodiment, the array 440 of applicators 42 may be removable from the dielectric plate 450 (e.g., for maintenance, to rearrange the array of applicators to accommodate a substrate with different dimensions, or for any other reason) without needing to remove the dielectric plate 450 from the chamber 278. Accordingly, the applicators 242 may be removed without needing to release a vacuum in the chamber 278. According to an additional embodiment, the dielectric plate 450 may also function as a gas injection plate or a showerhead.

Figure 5:
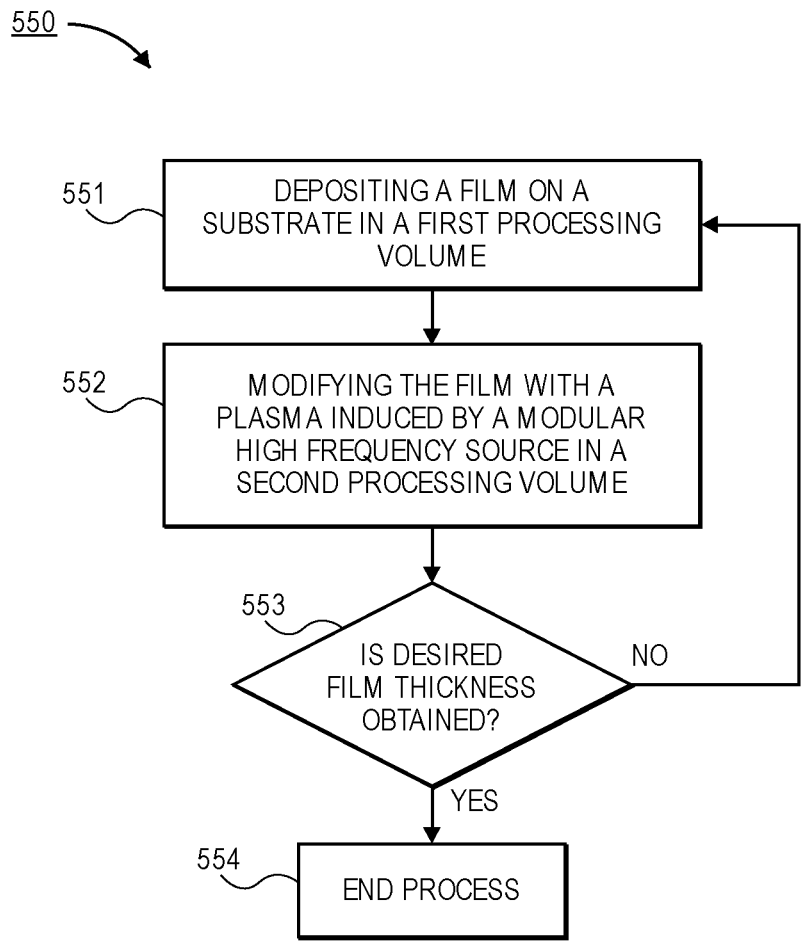
FIG. 5 is a process flow diagram illustrating a process for forming a thin film, in accordance with an embodiment.

Referring now to FIG. 5, a process flow diagram of a process 550 for forming a high quality thin film of silicon nitride is shown, in accordance with an embodiment. In an embodiment, process 550 may be implemented in a processing tool such as processing tool 100 described above in FIG. 1A or FIG. 1B that includes at least a first processing volume 170 for depositing the thin film and a second processing volume 180 for modifying the thin film. In an embodiment, process 550 may also be implemented in two or more different processing tools. For example, a first processing volume for depositing the thin film may be located in a first processing tool, and a second processing volume for modifying the thin film may be located in a second processing tool. In other embodiments, process 550 may also be implemented in a single processing volume. That is, the first processing volume for depositing the thin film may be the same processing volume as the second processing volume for modifying the thin film.

In an embodiment, process 550 may begin with operation 551 which includes depositing a film on a substrate in a first processing volume. In an embodiment, the film may be deposited over a patterned substrate or an unpatterned substrate. The film may be deposited with a CVD, PECVD, ALD, or PEALD process. In a particular embodiment, the deposition of the film may also include in-situ treatment of the film in the first processing volume. For example, the processing operation 551 may comprise sub-operations of: 1) depositing the film; 2) treating the film with a first plasma; and 3) etching the film. The etching of the film may not entirely remove the film from the substrate. Such an etching operation may be implemented in order to improve the step coverage of the film over a patterned substrate. In an embodiment, one or more of the sub-operations 1-3 may be repeated in order to provide a film with a desired thickness.

In an embodiment, operation 550 may then continue with operation 552 which includes modifying the silicon nitride film with a second plasma induced by a modular high-frequency plasma source in a second processing volume. In an embodiment, the modular high-frequency plasma source may be a plasma source such as the ones described above with respect to FIGS. 2-4. In an embodiment, the second plasma may be a different plasma than the first plasma used to treat the deposited film in operation 551.

In an embodiment, the use of a modular high-frequency plasma source provides a dense plasma with a high concentration of excited neutral species for treating the surface of the film. A dense plasma with a high concentration of a species of the film provides a modified film that has an improved bonding surface for subsequently deposited layers of the film. In an embodiment, the high-frequency plasma source may have a power density of approximately 5 W/cm$^2$ or greater. Accordingly, a denser film may be provided. For example, in the case of a PECVD silicon nitride film, the plasma may have a high concentration of nitrogen in order to provide additional nitrogen sites on the modified surface. In an embodiment, the plasma induced with a modular high-frequency plasma source may also reduce the hydrogen concentration of the film.

In an embodiment, the use of a plasma induced by a modular high-frequency plasma source also allows for thin films to be treated without damaging underlying layers below the film. For example, the film may have a thickness of less than 1 nm and still not result in negative interactions with underlying layers. In a particular embodiment, the underlying layers are not damaged because of the relatively low sheath potential of the plasma. For example, a plasma induced with a modular high-frequency plasma source may have a sheath potential that is an order of magnitude lower than a sheath potential of an RF plasma. In an embodiment, the sheath potential of a plasma induced with a modular high-frequency plasma may be less than approximately 100 V or less than approximately 25 V. In a particular embodiment, the sheath potential is approximately 10 V.

In an embodiment, operation 550 may continue with operation 553 which includes determining if a desired film thickness has been obtained. When the desired film thickness has not been reached, operation 550 may loop back to operation 551 and a second layer of the film may be deposited. When the desired film thickness has been reached, operation 550 may continue to operation 553 which includes ending the process at operation 554.

In FIG. 5, process 550 is shown as implementing operations 551 and 552 sequentially to provide a film with a desired thickness. However, it is to be appreciated that process 550 need not proceed in a sequential pattern. For example, operation 551 (i.e., the deposition process) may be repeated a plurality of times before operation 552 (i.e., the treatment process) is implemented. Additionally, one or more of the sub-operations 1-3 may be repeated any number of times (either sequentially or in any other order) before operation 552 is implemented. In other embodiments, operation 552 may be implemented between sub-operations 1-3.

In an embodiment, the film that is deposited in operation 551 may be a silicon nitride thin film. The formation of a silicon nitride thin film using process 550 is described in greater detail below.

In an embodiment, process 550 may begin with operation 551 which includes depositing a film comprising silicon on a substrate. In an embodiment, the film comprising silicon may be deposited with a PECVD process. In an embodiment, a first processing volume suitable for PECVD deposition may be used to deposit the film comprising silicon. In an embodiment, an RF power of between 50 W and 2.50 kW may be delivered to the chamber while flowing ammonia and one or more silicon precursors (e.g., SiH$_4$, trisilylamine (TSA), etc.) into the first processing volume. In an embodiment, the first processing volume may have a pressure maintained between 1 torr and 50 torr, and heater temperatures maintained between 30° C. and 500° C. In some embodiments, the plasma power delivered to the first processing volume is pulsed with a frequency between 1 kHz and 20 kHz with duty cycles between 1% and 40%. The time for such a deposition process may range from 0.01 s to hundreds of seconds, depending on the desired thickness of the film. In an embodiment, the first processing volume is purged (e.g., with a $N_2$) after the deposition to allow residual products to desorb as the pressure is brought to base inside the first processing volume.

In an embodiment, operation 551 may continue with an in-situ plasma treatment with exposure to a $N_2$ and He plasma at a power between 20 W and 2000 W maintained at a pressure between 0.05 torr and 25 torr to form a silicon nitride film. In an embodiment, a purge (e.g., with $N_2$) may follow the plasma treatment. In an embodiment, the first sub-operation (i.e., deposition with silicon precursor) and the second sub-operation (i.e., plasma treatment with $N_2$ and He) may be looped any number of times to provide a desired film thickness.

In an embodiment operation 551 may continue with a third sub-operation that includes an etching process. For example, the third sub-operation may include an in-situ pulsed plasma with one or more etching gases (e.g., $NF_3$, $F_2$, $Cl_2$, $CF_4$, etc.). In an embodiment, the power to the etching gas plasma may be 10 W-2500 W. In an embodiment a gas flow range of $N_2$ may be from 1 slm to 20 slm, and a gas flow range of the etching gas may be between 0 sccm to 1000 sccm. In an embodiment, the time of the etching sub-operation may be between 0 s and 120 s. The pulsed RF power parameters may range from 1% to 30% duty cycle in some embodiments. In an embodiment, the pulse frequency of such RF power may range between 1 kHz and 30 kHz. In an embodiment, the etching sub-operation may be used to improve the step coverage of the deposited film over a patterned substrate.

In an embodiment, process 550 may then continue with operation 552 which includes treating the film with a plasma induced by a high-frequency plasma source in a second processing volume. In an embodiment, the high-frequency plasma may be induced from gasses comprising nitrogen and an inert buffer gas (e.g., argon, etc.). In an embodiment, the gas flows may be 0.01 sccm to 50 sccm. In an embodiment, the second processing volume may be maintained at a pressure between 0.01 torr and 25 torr. In an embodiment, the temperature may be maintained between 20° C. and 400° C. In an embodiment, the distance between the applicators of the high-frequency plasma source and the substrate may be between 1 mm and 250 mm. In an embodiment, the high-frequency plasma source may have a power density of approximately 5 $W/cm^2$ or greater, approximately 10 $W/cm^2$ or greater, or approximately 20 $W/cm^2$ or greater. In an embodiment, the sheath potential of a plasma induced with a modular high-frequency plasma may be less than approximately 100 V or less than approximately 25 V. In a particular embodiment, the sheath potential is approximately 10 V.

Figure 6A:
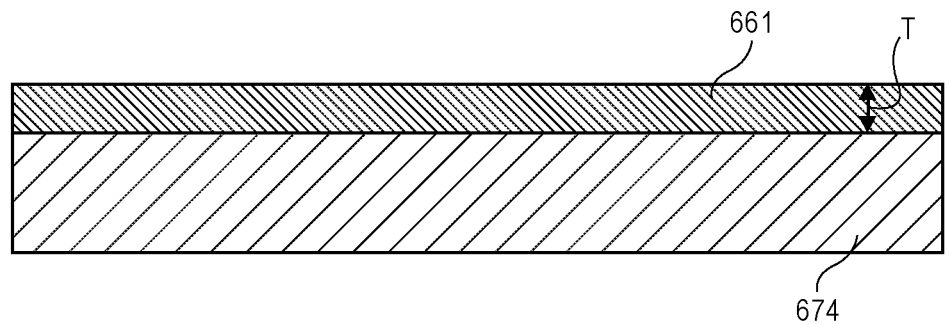
FIGS. 6A-6C are cross-sectional illustrations of a substrate on which a thin film is deposited, in accordance with an embodiment.
Figure 6B:
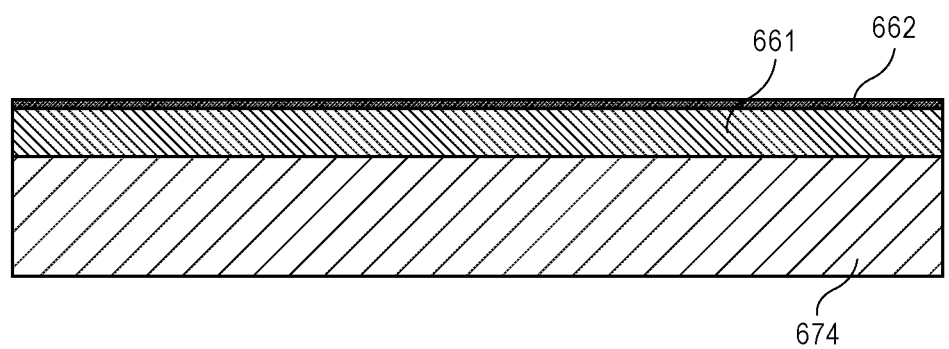
Figure 6C:
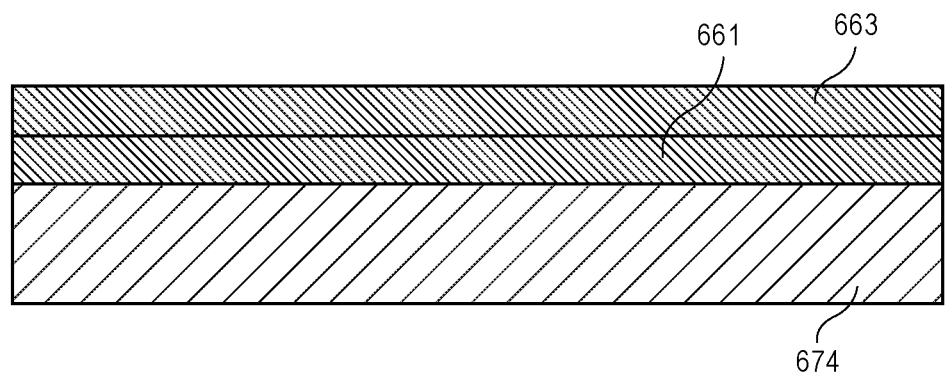

Referring now to FIGS. 6A-6C, a series of cross-sectional illustrations of a substrate onto which a high-quality thin film of silicon nitride is deposited using a process such as process 550 described above is shown, in accordance with an embodiment.

Referring now to FIG. 6A, a cross-sectional illustration of a substrate 674 is shown, in accordance with an embodiment. In the illustrated embodiment, the substrate 674 is shown as an unpatterned substrate. However, it is to be appreciated that the substrate 674 may include a patterned surfaces (e.g., including trenches, steps, or the like). In an embodiment, a film 661 may be deposited over a surface of the substrate 674. For example, the film 661 may be deposited with an operation similar to operation 551 described above. Particularly, the film 661 may be deposited with a CVD, PECVD, ALD, or PEALD process. In an embodiment, the film 661 may be a thin film. That is, the thickness T of the film 661 may be 50 nm or less. In an embodiment, the thickness T of the film 661 may be 10 nm or less. In an embodiment, the thickness T of the film 661 may be 1 nm or less. In an embodiment, the film 661 may be silicon nitride. In embodiments where the substrate is patterned, the film 661 may be conformal to the topography of the patterned substrate.

Referring now to FIG. 6B, a cross-sectional illustration after the film is treated with a plasma induced by a modular high-frequency plasma source is shown, in accordance with an embodiment. In an embodiment, the plasma treatment may be substantially similar to the treatment implemented in operation 552 described above. In an embodiment, the treated film 661 may have a modified surface 662. For example, in the case of a silicon nitride film, the modified surface 662 may have an increased density of nitrogen species available for bonding with a subsequently deposited layer of the film. Accordingly, the density of the film is improved. In an embodiment, the modified surface 662 may also have a reduced concentration of hydrogen. In FIG. 6B, the modified surface 662 is shown as being located substantially proximate to the top surface of the film 661. However, it is to be appreciated that the any portion of the film 661 (up to the entire thickness of the film 661) may be modified by the plasma treatment.

Referring now to FIG. 6C, a cross-sectional illustration after a second layer 663 is deposited over the film 661 is shown, in accordance with an embodiment. In an embodiment, the second layer 663 may be the same material as the film 661 (e.g., silicon nitride). In an embodiment, the modified surface 662 improves the bonding between the film 661 and the second layer 663 in order to provide a film with a higher quality.

Figure 7:
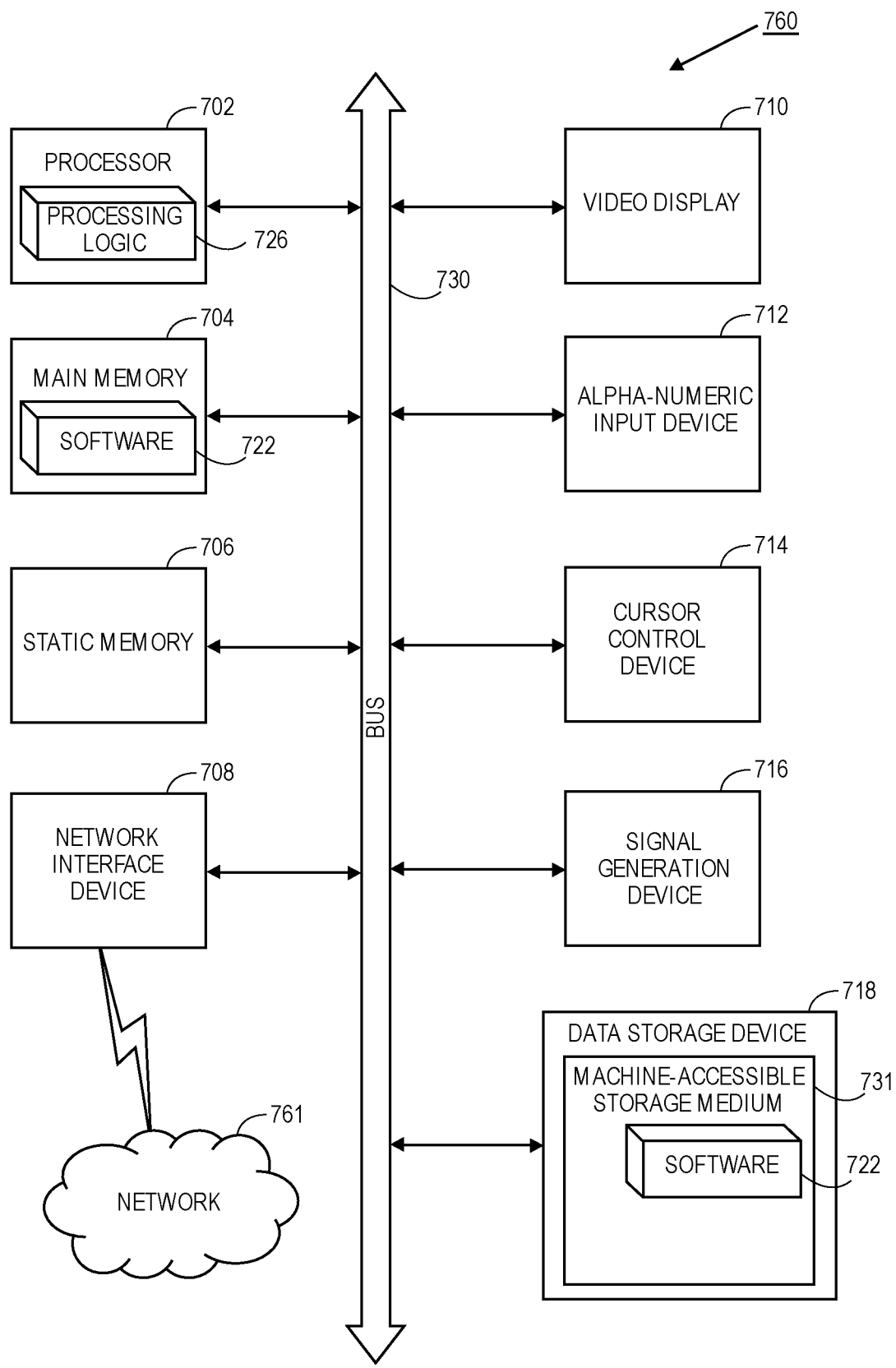
FIG. 7 illustrates a block diagram of an exemplary computer system that may be used in conjunction with a modular microwave radiation source, in accordance with an embodiment.

Referring now to FIG. 7, a block diagram of an exemplary computer system 760 of a processing tool 100 is illustrated in accordance with an embodiment. In an embodiment, computer system 760 is coupled to and controls processing in the processing tool 100. Computer system 760 may be connected (e.g., networked) to other machines in a Local Area Network (LAN), an intranet, an extranet, or the Internet. Computer system 760 may operate in the capacity of a server or a client machine in a client-server network environment, or as a peer machine in a peer-to-peer (or distributed) network environment. Computer system 760 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 760, the term "machine" shall also be taken to include any collection of machines (e.g., computers) that individually or jointly execute a set (or multiple sets) of instructions to perform any one or more of the methodologies described herein.

Computer system 760 may include a computer program product, or software 722, having a non-transitory machine-readable medium having stored thereon instructions, which may be used to program computer system 760 (or other electronic devices) to perform a process such as process 550 according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 760 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 760 may further include a system network interface device 708 for communicating with other devices or machines. The computer system 760 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 731 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 760, the main memory 704 and the system processor 702 also constituting machine-readable storage media. The software 722 may further be transmitted or received over a network 720 via the system network interface device 708.

While the machine-accessible storage medium 731 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of depositing a film on a substrate, comprising:
    forming a silicon nitride film over a surface of the substrate in a first processing volume with a deposition process; and
    treating the film in a second processing volume, wherein treating the film comprises exposing the film to a plasma induced by a modular high-frequency plasma source, wherein a sheath potential of the plasma is less than 100 V, and wherein a power density of the high-frequency plasma source is approximately 5 W/cm$^2$ or greater.

2. The method of claim 1, wherein the first deposition process comprises chemical vapor deposition (CVD), plasma enhanced CVD (PECVD), atomic layer deposition (ALD), or plasma enhanced ALD (PEALD).

3. The method of claim 1, wherein the deposition process comprises:
    depositing a film comprising silicon onto the surface of the substrate;
    an in-situ plasma treatment of the film comprising silicon, wherein the plasma treatment includes a plasma comprising nitrogen and helium to form the silicon nitride film; and
    a pulsed plasma etch.

4. The method of claim 1, wherein the first processing volume and the second processing volume are in the same tool.

5. The method of claim 1, wherein the first processing volume and the second processing volume are in different tools.

6. The method of claim 1, further comprising:
    sequentially repeating the operations of forming the silicon nitride film over the surface of the substrate in the first processing volume and treating the silicon nitride film in a second processing volume until a desired film thickness is obtained.

7. The method of claim 6, wherein each iteration of forming the silicon nitride film over the surface of the substrate increases a thickness of the silicon nitride film by less than approximately 1 nm.

8. The method of claim 6, wherein the desired film thickness is 50 nm or less.

9. The method of claim 1, wherein the substrate is a patterned substrate.

10. The method of claim 1, wherein the substrate is an unpatterned substrate.

11. The method of claim 1, wherein the modular high-frequency plasma source comprises:
    a plurality of high-frequency plasma source modules, wherein each high-frequency plasma source module, comprises:
    an oscillator module, wherein the oscillator module comprises:
        a voltage control circuit; and
        a voltage controlled oscillator;
    an amplification module, wherein the amplification module is coupled to the oscillator module; and
    an applicator, wherein the applicator is coupled to the amplification module.

12. The method of claim 11, wherein the high-frequency is 0.1 MHz to 300 GHz.

13. A method of depositing a film on a substrate, comprising:

depositing a film comprising silicon over a surface of the substrate in a first processing volume;

treating the film with a first plasma process, wherein the first plasma process is an RF induced plasma comprising nitrogen and helium to form a silicon nitride film;

exposing the silicon nitride film to a second plasma process, wherein the second plasma process is an RF induced plasma comprising species suitable for etching the silicon nitride film; and treating the silicon nitride film with a third plasma process in a second processing volume, wherein the third plasma process comprises a plasma induced by a modular high-frequency plasma source.

14. The method of claim 13, wherein the film comprising silicon is deposited with chemical vapor deposition (CVD), plasma enhanced CVD (PECVD), atomic layer deposition (ALD), or plasma enhanced ALD (PEALD).

15. The method of claim 13, wherein the method is repeated a plurality of times to provide a film with a desired thickness.

16. The method of claim 13, wherein the modular microwave plasma source comprises:
a plurality of high-frequency plasma source modules, wherein each high-frequency plasma source module, comprises:
an oscillator module, wherein the oscillator module comprises:
a voltage control circuit; and
a voltage controlled oscillator;
an amplification module, wherein the amplification module is coupled to the oscillator module; and
an applicator, wherein the applicator is coupled to the amplification module.

17. A method of forming a high quality silicon nitride film, comprising:
(a) depositing a film comprising silicon over a surface of a substrate with a plasma enhanced chemical vapor deposition (PECVD) process in a first processing volume;
(b) treating the film comprising silicon in-situ with a first RF plasma, wherein the first RF plasma comprises nitrogen and helium to form a silicon nitride film;
(c) etching the silicon nitride with a second RF plasma, wherein the second RF plasma comprises one or more of fluorine, chlorine, nitrogen, and carbon; and
(d) treating the silicon nitride film with a microwave plasma, wherein the microwave plasma is induced by a modular microwave plasma source.

18. The method of claim 17, wherein one or more of operations (a), (b), (c), and (d) are repeated a plurality of times.

19. The method of claim 17, wherein one or more of operations (a), (b), and (c) may be repeated a plurality of times before operation (d) is implemented.

20. The method of claim 17, wherein the modular microwave plasma source comprises:
a plurality of microwave plasma source modules, wherein each microwave plasma source module, comprises:
an oscillator module, wherein the oscillator module comprises:
a voltage control circuit; and
a voltage controlled oscillator;
an amplification module, wherein the amplification module is coupled to the oscillator module; and
an applicator, wherein the applicator is coupled to the amplification module.

* * * * *